(12) United States Patent
Tolson

(10) Patent No.: US 6,374,086 B1
(45) Date of Patent: Apr. 16, 2002

(54) RADIO TRANSMITTER/RECEIVER

(75) Inventor: Nigel James Tolson, Berkshire (GB)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/261,184

(22) Filed: Mar. 3, 1999

(30) Foreign Application Priority Data

Mar. 5, 1998 (GB) .............................................. 9804708

(51) Int. Cl.⁷ ................................................. H04B 1/38
(52) U.S. Cl. ............................ 455/73; 455/84; 455/307
(58) Field of Search .............................. 455/73, 75–76, 455/78, 82–84, 307, 179.1, 180.1, 188.1, 200.1

(56) References Cited

U.S. PATENT DOCUMENTS

| | | | | |
|---|---|---|---|---|
| 4,513,447 A | * | 4/1985 | Carson | 455/76 |
| 4,965,852 A | * | 10/1990 | Sasaki | 455/78 |
| 5,335,364 A | * | 8/1994 | Heinonen | 455/76 |
| 5,550,520 A | * | 8/1996 | Kobayashi | 333/213 |
| 5,748,046 A | * | 5/1998 | Badger | 331/17 |
| 5,812,612 A | * | 9/1998 | Saito | 455/78 |
| 5,930,686 A | * | 7/1999 | Devllin et al. | 455/78 |
| 5,999,824 A | * | 12/1999 | Na | 455/78 |
| 6,169,447 B1 | * | 1/2001 | Tolson | 327/557 |

* cited by examiner

Primary Examiner—Doris H. To
(74) Attorney, Agent, or Firm—Sughrue Mion, PLLC

(57) ABSTRACT

The output of a fixed frequency local oscillator is multiplied in frequency by a frequency multiplier and used in the mixer of the first down-conversion stage of a heterodyne receiver. Receiver channel selection and tuning takes place at IF by means of a PLL, the phase detector for the receiver PLL being used also as the phase detected for the transmitter tracking loop PLL. The multiplied local oscillator output is also used in the mixer of the transmitter tracking loop.

12 Claims, 1 Drawing Sheet

RADIO TRANSMITTER/RECEIVER

BACKGROUND OF THE INVENTION

1. Field of the Invention

This invention relates to a radio transmitter/receiver, and more particularly to operating channel selection.

2. Description of the Related Art

A reduction in cost and an improvement in reliability are amongst the benefits that may be obtained when it is possible to achieve a reduction in the number of separate components of a radio transmitter/receiver. Improvements in the performance of the radio may also be obtained by means of the integration of components previously required to be provided separately. Also a minimum bandwidth for the IF filter, consistent with adequate reception of the wanted signal will enhance receiver performance considerably.

SUMMARY OF THE INVENTION

It is an object of the present invention to provide a improved means for frequency and channel selection for both receiver and transmitter in a radio transmitter/receiver while reducing the number of separate components required.

According to the present invention there is provided a radio transmitter/receiver, the receiver having a first, fixed frequency local oscillator the output from the fixed frequency local oscillator being multiplied in frequency by a frequency multiplier to provide an input to a first mixer for down-conversion of input RF signals to IF, the IF frequencies being selected by a voltage controlled band-pass filter for down-conversion to base-band signals in a second mixer by mixing with an output from a second, variable frequency local oscillator.

The above and other objects, features, and advantages of the present invention will become apparent from the following description with references to the accompanying drawings which illustrate examples of the present invention.

DETAILED DESCRIPTION OF THE PREFERRED EMBODIMENTS

Figure 1:
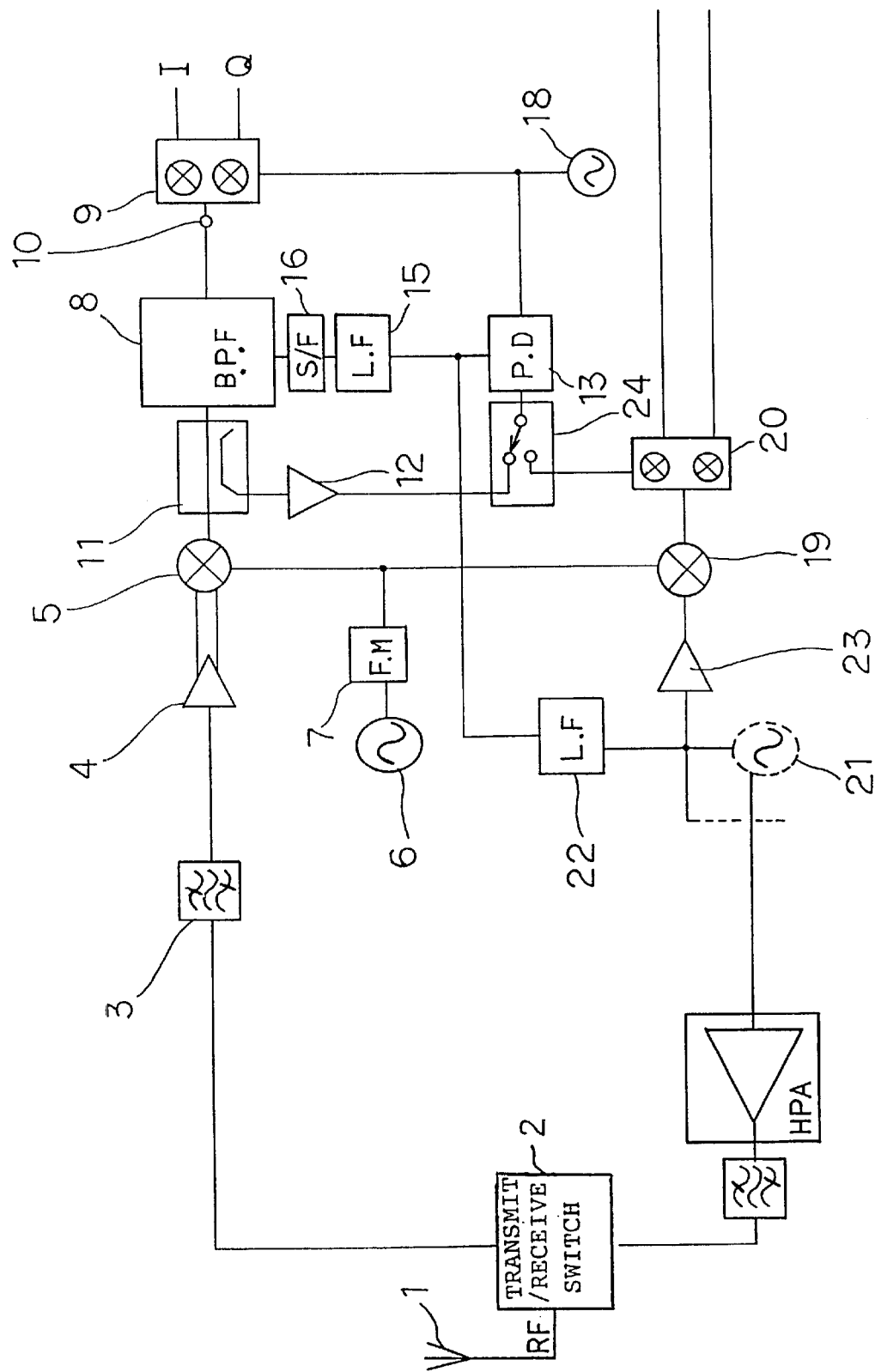
FIG. 1 is a block diagram showing an example of part of a radio transmitter/receiver of the present invention.

An example of the present invention will now be described with reference to the sole FIG. 1 which is a block diagram of part of a radio transmitter/receiver.

With reference to FIG. 1, an incoming radio frequency (RF) signal from an antenna 1 is fed via transmit/receive switch 2 and band-pass filter 3 to low noise amplifier 4. The function of low noise amplifier 4 is to enhance the signal to noise performance of the receiver and to reduce any unwanted transmission from the receiving antenna at radio frequencies. The amplified signal from low noise amplifier 4 is then mixed in first mixer 5 with the output from fixed frequency local oscillator 6.

The frequency of fixed frequency local oscillator 6 is fixed and the output from fixed frequency local oscillator 6 is doubled in frequency in frequency multiplier (F.M) 7 before passing to first mixer 5, at twice the frequency of fixed frequency local oscillator 6, to mix with the incoming, filtered and amplified RF signals to produce an intermediate frequency (IF) output from first mixer 5.

Use of the frequency multiplier 7 enables a lower frequency oscillator to be used as a local oscillator which provides an easing of tolerances so as to permit discrete implementation of the oscillator.

The output from first mixer 5 is fed to an active band-pass filter (B.P.F) 8 forming part of a phase locked loop (PLL). The configuration and operation of the active band-pass filter 8 and associated PLL when used as a pre-selector filter for a direct conversion receiver is the subject of our co-pending application GB 9725674.7. In the present invention, however, active band-pass filter 8 and associated PLL operates at IF and has been improved.

The active band-pass filter 8 is a voltage controlled band-pass filter and may be constructed as an MMIC active filter, a description of an MMIC active filter can be found in IEEE Transactions on microwave theory and techniques Volume 37 number 12 December 1989, Manfred J. Schindler and Yusuke Tajima. The bandwidth of active band-pass filter 8 is sufficient to accommodate a signal channel.

The filtered IF signals from active band-pass filter 8 are fed to second mixer 9. Variable frequency local oscillator 18 provides an output at the IF of the reception channel required. The isolation of the local oscillator signal (variable frequency local oscillator 18) from the incoming IF port 10 provided by second mixer 9 is typically only 15 dB and therefore a substantial breakthrough of the local oscillator energy to the IF port 10 occurs.

The energy from the local oscillator appearing at IF port 10 passes through active band-pass filter 8 with a change of phase. The amount and direction of the phase change of the local oscillator breakthrough passing through the active band-pass filter 8 is determined by the difference between the frequency of the variable frequency local oscillator 18 breakthrough and the current center frequency of tunable active band-pass filter 8.

The local oscillator energy passing through active band-pass filter 8 is coupled via RF coupler 11 to first amplifier 12, where it is amplified and applied to a port of phase detector (P.D) 13. A further output from variable frequency local oscillator 18 is fed to a second port of phase detector 13. Phase detector 13 compares the phase of the signals appearing at its ports and provides an output proportional to the difference in phase of the two signals.

The output from phase detector 13, the error signals, is fed to first loop filter (L.F) 15, and the output voltage from the first loop filter 15 is applied, via sample and hold circuit (S/F) 16 to the voltage control input of the active band-pass filter 8 thereby forming a phase locked loop. The action of the phase locked loop is to drive the center frequency of the pass band of active band-pass filter 8 towards the frequency of the variable frequency local oscillator 18, the local oscillator frequency having been set for use with the selected operating channel.

The sample and hold circuit 16 is included in the control loop between first loop filter 15 and active band-pass filter 8. The sample and hold circuit 16 is capable of being switched to provide a fixed voltage at the control input of the active band-pass filter 8. This would occur when the center frequency of active band-pass filter 8 approximates to the center frequency of the selected channel bandwidth and during 'receive' for a TDMA system. When the control voltage for active band-pass filter 8 is be maintained at a fixed value, parts of the control circuit are disabled thereby to effect a saving of power during normal operation of the telephone in a single channel.

The receiver phase locked loop does not operate while the sample and hold circuit 16 supplies a fixed voltage to control active band-pass filter 8. When a different channel is selected the phase locked loop circuit is enabled and the filter is tuned to accept the new channel frequencies.

The I and Q outputs from second mixer 9 which are at base-band frequencies are passed to amplification stages and then to standard processing circuit such as are well known in the art see for example 'Mobile Radio Communications' by R Steels(Ed) 1992 published by John Wiley & Sons.

When the transmitter is to be aligned to the correct channel frequency the phase detector 13 and the fixed frequency local oscillator 6 and frequency multiplier 7 are included in the transmitter tracking loop. The use of these components for both receiver and transmitter channel selection provides a reduction in the number and cost of components. A smaller area of silicon is required also. Additionally there is no need for a surface acoustic wave (SAW) filter to be included in the IF stage of the receiver. SAW filters normally cannot be integrated fully into the Application Specific Integrated Circuit (hereinafter referred to as "ASIC") because of the need for hermetic sealing.

The transmitter tracking PLL, comprises VCO (Voltage Controlled Oscillator) 21, second loop filter (L.F) 22, phase detector 13, quadrature modulator 20, third mixer 19 and second amplifier 23 and is activated by switch 24. By the action of switch 24 the phase detector 13 forms part of either one of the phase locked loops for the transmitter tracking loop or the receiver voltage controlled band-pass filter (active band-pass filter 8) control loop with a consequent reduction in the component count.

A further saving of components is achieved by means of the use of an output from the frequency multiplier 7 as input to third mixer 19. The transmitter tracking loop therefore, while otherwise operating in accordance with prior art methods, does not require a UHF oscillator and shares its phase detector with the receiver voltage controlled band-pass filter control loop.

While a preferred embodiments of the present invention have been described using specific terms, such description is for illustrative-purposes only, and it is to be understood that changes and variations may be made without departing from the spirit or scope of the following claims.

What is claimed is:

1. A radio transmitter/receiver having a voltage controlled band-pass filter, which receives an IF input and feeds the filtered IF from the voltage controlled band-pass filter as an input to a mixer for mixing with an output of a variable frequency local oscillator, the output of the variable frequency local oscillator being fed also to a phase detector for comparison with a modified variable frequency local oscillator output obtained as leakage from the mixer having passed through the voltage controlled band-pass filter and an output from the phase detector applied through a loop filter and through a sample and hold circuit as a control voltage to the voltage controlled band-pass filter.

2. The radio transmitter/receiver according to claim 1 wherein said voltage controlled band-pass filter in which the local oscillator output obtained as leakage from the mixer having passed through the voltage controlled band-pass filter is fed to the phase detector via an RF coupler and amplifier.

3. The radio transmitter/receiver according to claim 2 wherein said voltage controlled band-pass filter is implemented as an integral part of an ASIC receiver.

4. The radio transmitter/receiver according to claim 3 wherein said voltage controlled band-pass filter is an active filter.

5. The radio transmitter/receiver according to claim 2 wherein said voltage controlled band-pass filter is an active filter.

6. The radio transmitter/receiver according to claim 1 wherein said phase detector forms part of either a transmitter tracking loop or a receiver voltage controlled band-pass filter control loop by the action of a switch.

7. The radio transmitter/receiver according to claim 6 wherein said voltage controlled band-pass filter is implemented as an integral part of an ASIC receiver.

8. The radio transmitter/receiver according to claim 7 wherein said voltage controlled band-pass filter is an active filter.

9. The radio transmitter/receiver according to claim 6 wherein said voltage controlled band-pass filter is an active filter.

10. The radio transmitter/receiver according to claim 1 wherein said voltage controlled band-pass filter is implemented as an integral part of an ASIC receiver.

11. The radio transmitter/receiver according to claim 10 wherein said voltage controlled band-pass filter is an active filter.

12. The radio transmitter/receiver according to claim 1 wherein said voltage controlled band-pass filter is an active filter.

* * * * *

UNITED STATES PATENT AND TRADEMARK OFFICE
CERTIFICATE OF CORRECTION

PATENT NO. : 6,374,086 B1 Page 1 of 1
DATED : April 16, 2002
INVENTOR(S) : Nigel James Tolson It is certified that error appears in the above-identified patent and that said Letters Patent is hereby corrected as shown below:

<u>Title page,</u>
Item [30], please delete Priority Data "9804708" and insert Priority Data
-- 9804708.7 --

Signed and Sealed this

Twenty-sixth Day of November, 2002

*Attest:*

JAMES E. ROGAN
*Attesting Officer* *Director of the United States Patent and Trademark Office*